United States Patent
Gopalakrishnan

(10) Patent No.: US 11,921,650 B2
(45) Date of Patent: *Mar. 5, 2024

(54) DEDICATED CACHE-RELATED BLOCK TRANSFER IN A MEMORY SYSTEM

(71) Applicant: Rambus Inc., San Jose, CA (US)

(72) Inventor: Liji Gopalakrishnan, Sunnyvale, CA (US)

(73) Assignee: Rambus Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/117,119

(22) Filed: Mar. 3, 2023

(65) Prior Publication Data

US 2023/0281137 A1   Sep. 7, 2023

Related U.S. Application Data

(63) Continuation of application No. 17/581,659, filed on Jan. 21, 2022, now Pat. No. 11,599,483, which is a continuation of application No. 15/931,405, filed on May 13, 2020, now Pat. No. 11,232,047.

(60) Provisional application No. 62/853,619, filed on May 28, 2019.

(51) Int. Cl.
*G06F 13/16* (2006.01)
*G11C 11/4093* (2006.01)
*G11C 11/4096* (2006.01)

(52) U.S. Cl.
CPC ...... *G06F 13/1668* (2013.01); *G11C 11/4093* (2013.01); *G11C 11/4096* (2013.01)

(58) Field of Classification Search
CPC ............. G06F 13/1668; G11C 11/4093; G11C 11/4096
See application file for complete search history.

(56) References Cited

U.S. PATENT DOCUMENTS

| | | | |
|---|---|---|---|
| 8,041,885 B2 | 10/2011 | Jo et al. | |
| 9,348,539 B1 * | 5/2016 | Saxena | G11C 11/005 |
| 9,767,903 B2 | 9/2017 | Cho | |
| 10,241,727 B1 | 3/2019 | Shallal | |
| 10,254,967 B2 | 4/2019 | Ouyang et al. | |
| 10,528,286 B2 | 1/2020 | Madpur et al. | |

(Continued)

FOREIGN PATENT DOCUMENTS

KR    10-0685324 B1    2/2007
WO   WO-PCT/US17/062645    11/2017

OTHER PUBLICATIONS

Donghyuk Lee et al., "Decoupled Direct Memory Access: Isolating CPU and IO Traffic by Leveraging a Dual-Data-Port DRAM" 2015 International Conference on Parallel Architecture and Compilation, 2015. 14 pages.

*Primary Examiner* — Eric T Oberly
(74) *Attorney, Agent, or Firm* — Lowenstein Sandler LLP

(57) ABSTRACT

A memory system includes a dynamic random access memory (DRAM) device, a second memory device, and a memory controller circuit. The memory controller circuit is coupled to the DRAM device by a first data channel configured to transfer first data between the memory controller circuit and the DRAM device on behalf of a host, and is also coupled to the DRAM device by a second data channel configured to transfer second data between the memory controller circuit and the DRAM device on behalf of the second memory device while the first data is being transferred across the first data bus.

20 Claims, 8 Drawing Sheets

(56) References Cited

U.S. PATENT DOCUMENTS

| | | |
|---|---|---|
| 2009/0039927 A1 | 2/2009 | Gillingham et al. |
| 2011/0276775 A1 | 11/2011 | Schuetz |
| 2013/0073802 A1* | 3/2013 | Haywood ............... G06F 13/36 |
| | | 711/E12.001 |
| 2014/0122777 A1 | 5/2014 | Oh et al. |
| 2018/0210787 A1* | 7/2018 | Bains .................... G11C 11/409 |
| 2019/0286560 A1 | 9/2019 | Shallal |

* cited by examiner

DEDICATED CACHE-RELATED BLOCK TRANSFER IN A MEMORY SYSTEM

RELATED APPLICATION

This application is a continuation application of U.S. patent application Ser. No. 17/581,659, filed Jan. 21, 2022, which a continuation application of U.S. patent application Ser. No. 15/931,405, filed May 13, 2020, now U.S. Pat. No. 11,232,047, which claims the benefit of U.S. Provisional Application No. 62/853,619, filed May 28, 2019, the entire contents of all are hereby incorporated by references.

BACKGROUND

Modern computer systems generally include a data storage device, such as a memory component. The memory component may be, for example a random access memory (RAM) or a dynamic random access memory (DRAM). The memory component includes memory banks made up of storage cells which are accessed by a memory controller or memory client through a command interface and a data interface within the memory component.

BRIEF DESCRIPTION OF THE DRAWINGS

The present disclosure is illustrated by way of example, and not by way of limitation, in the figures of the accompanying drawings.

DETAILED DESCRIPTION

Figure 1:
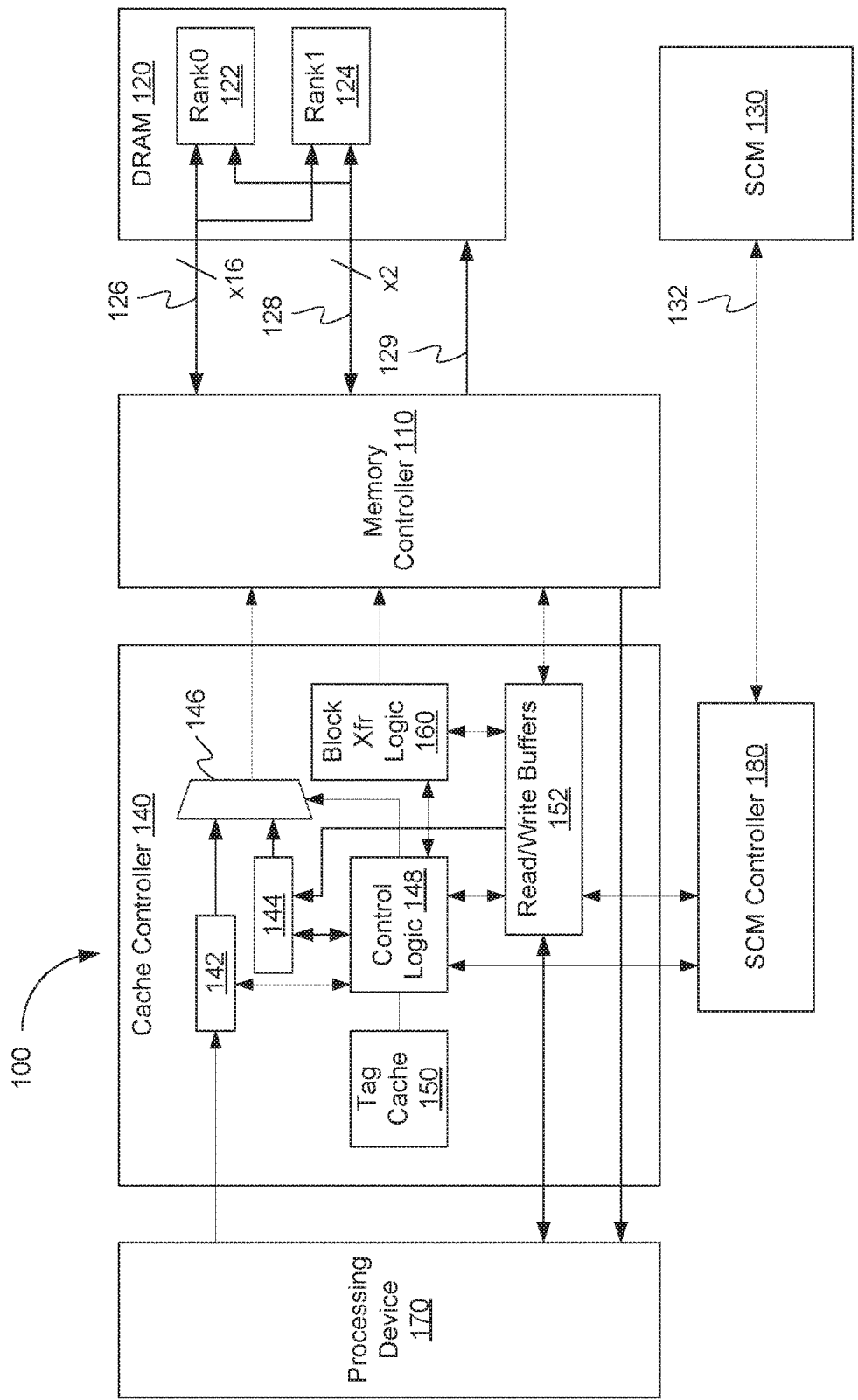
FIG. 1 is a block diagram illustrating a memory system with a cache and a dedicated block transmission channel, according to an embodiment.

The following description sets forth numerous specific details such as examples of specific systems, components, methods, and so forth, in order to provide a good understanding of several embodiments of the present disclosure. It will be apparent to one skilled in the art, however, that at least some embodiments of the present disclosure may be practiced without these specific details. In other instances, well-known components or methods are not described in detail or are presented in simple block diagram format in order to avoid unnecessarily obscuring the present disclosure. Thus, the specific details set forth are merely exemplary. Particular implementations may vary from these exemplary details and still be contemplated to be within the scope of the present disclosure.

Described herein is a system and method for external block transfer in a memory system. In certain memory systems, the storage media used as main memory may have certain disadvantages, such as having slower access times, thereby causing latencies when servicing data access requests. Accordingly, these memory systems may implement a cache memory to temporarily store frequently accessed data using a different type of storage media. For example, the cache memory may be implemented using media with faster access times in order to reduce latencies associated with host data accesses. These memory systems that utilize two types of storage media may be referred to as "hybrid" memory systems.

The hybridization of memory systems, including mobile systems, using high-speed and expensive dynamic random access memory (DRAM), for example, as a cache memory for low-cost but slower storage class memory (SCM), for example, can allow the memory system to have an increased memory capacity at a reduced cost per bit while still maintaining a desired level of performance (i.e., reduced latencies). SCM devices, such as low-latency 3D or vertical NAND (i.e., "Fast-Flash"), are persistent memory devices that are typically addressable using data blocks of fixed size, called cache lines. In certain memory systems, this optimum cache-line size, and thus the data transfer granularity between the main memory SCM device and the cache memory DRAM device, may be relatively large (e.g., 4 kilobytes).

Most memory systems utilize a memory controller and cache control logic to manage data transfers between the SCM and DRAM. Conventional memory systems, however, have only a single data channel between the memory controller and the DRAM device for a given physical address space. Accordingly, transfers of the large data blocks between the SCM and DRAM via the memory controller can impact the bandwidth available on the single data channel for other data transfers (e.g., related to other data access operations for portions of the DRAM device not being utilized as a cache). In addition to degrading performance by increasing the access latency of other requests to the same rank or a different rank of the DRAM device, use of the single data channel for SCM block data transfers can also change the profile of the DRAM data traffic for which efficient power management and frequency scaling techniques are optimized to enable the controller to minimize system power.

Aspects of the present disclosure can address the above and other considerations by, in some implementations, using an additional dedicated data channel between the memory controller and the DRAM device, as well as logic in the cache controller, to support block data transfer between the main memory SCM device and the cache memory DRAM device in response to specific commands from the memory controller. The embodiments described herein can minimize or at least reduce the impact of block data transfers between the SCM and DRAM on the performance and power management of the main DRAM data channel by directing the cache-related block data transfers to the second dedicated data channel. Thus, the main DRAM data channel can remain available to service data access requests for portions of the DRAM device not utilized as a cache for the SCM device. The use of the additional dedicated data channel can enhance system performance and simplify power management on the main DRAM channel in a hybrid memory system where block data movement between DRAM and SCM is managed by the memory controller. It further improves performance in memory systems using multiple ranks of DRAM devices by allowing the main DRAM channel to be used for random accesses to one rank, while performing concurrent block transfers between the other rank and the SCM device on the additional data channel, and simplifies power management and frequency scaling on both data channels by separating regular host traffic from cache miss/evict traffic. In other embodiments, the DRAM device and memory controller can be configured to operate in a normal/standard mode where the additional dedicated data channel and associated block transfer logic are disabled. Additional details of this block data transfer are provided below with respect to FIGS. 1-8.

FIG. 1 is a block diagram illustrating a memory system 100 with a cache and a dedicated block transmission channel, according to an embodiment. In one embodiment, the memory system 100 includes processing device 170 and one or more memory components, such as dynamic random access memory (DRAM) device 120 and storage class memory (SCM) device 130. While only a single memory system is illustrated, the terms "memory system" and "computing device" shall also be taken to include any collection of machines that individually or jointly execute a set (or multiple sets) of instructions to perform any one or more of the methodologies discussed herein. Depending on the implementation, the various components of the memory system 100, such as processing device 170, cache controller 140, memory controller 110, SCM controller 180, etc., can be discrete packages or be integrated in a system-on-a-chip (SOC) or as part of a stack.

Processing device 170 may be, for example, a multi-core processor including multiple cores. These cores may be physical processors, and may include various components such as front end units, execution units and back end units. Processing device 170 may represent one or more general-purpose processing devices such as a microprocessor, central processing unit, or the like. Processing device 170 may implement a complex instruction set computing (CISC) architecture, a reduced instruction set computer (RISC) architecture, a very long instruction word (VLIW) architecture, or other instruction sets, or a combination of instruction sets, through translation of binary codes in the above-mentioned instruction sets by a compiler. Processing device 170 may also be one or more special-purpose processing devices such as an application specific integrated circuit (ASIC), a field programmable gate array (FPGA), a digital signal processor (DSP), network processor, or the like. Processing device 170 may be configured to execute processing logic for performing the operations discussed herein.

Processing device 170 may employ execution units including logic to perform algorithms for processing data, such as in the embodiments described herein. The execution units may include logic to perform integer and floating point operations. The processing device 170, in one embodiment, includes a microcode (μcode) ROM to store microcode, which when executed, is to perform algorithms for certain macroinstructions or handle complex scenarios. Here, microcode is potentially updateable to handle logic bugs/fixes for processing device 170. One embodiment may be described in the context of a single processor system, but alternative embodiments may be included in a multiprocessor system. The processing device 170 may be coupled to a processor bus that transmits data signals between the processing device 170 and other components in the memory system 100.

In one embodiment, the memory system 100 further includes cache controller 140 and an optional processing device cache (not shown). The processing device cache, however, may be limited in size and/or capacity. Thus, cache controller 140 may further utilize a separate cache implemented in one of memory components, such as DRAM device 120. Depending on the embodiment, DRAM device 120 and SCM device 130 may be internal (e.g., on the same chip or package) or external to memory system 100. DRAM device 120 may include multiple ranks, such as rank0 122 and rank1 124. In one embodiment, the operations of DRAM device 120 and SCM device 130 are managed by a memory controller 110. In addition, or in the alternative, memory system 100 may include additional memory components, such as multiple DRAM or SCM devices, flash memory, read-only memory (ROM), synchronous DRAM (SDRAM), Rambus DRAM (RDRAM), static random access memory (SRAM), etc. In other embodiments, memory system 100 may include some other type of storage device for storing information in a form (e.g., software, processing application) readable by a machine (e.g., a computer). In one embodiment, DRAM device 120 may be part of a memory module, such as a dual in-line memory modules (DIMM), which comprises a series of DRAM integrated circuits mounted together on a printed circuit board.

In one embodiment, SCM device 130, or some other non-volatile memory device, may be used as a main memory for memory system 100. SCM device 130, however, may be slower, thus causing latencies in access times by processing device 170 or some other host device. Accordingly, in one embodiment, at least a portion of DRAM device 120, or some other volatile memory device, may be used as a cache memory to reduce the average memory access times. The cache memory may use at least a portion of the smaller, faster DRAM device 120 to store copies of data from the most frequently used locations in SCM device 130. In one embodiment, data is transferred between SCM device 130 and DRAM device 120 in blocks of fixed size, called cache lines. When a cache line is copied from SCM device 130 into DRAM device 120, a cache entry is created. The cache entry may include the copied data as well as an identifier formed from the requested memory location (i.e., the tag). In one embodiment, memory controller 110 is designated to manage operations of either DRAM device 120, SCM device 130, or both. In one embodiment, memory controller 110 may have multiple data channels by which it can individually control DRAM device 120 and SCM device 130. For example, memory controller 110 may receive data access requests (e.g., either for tag data, cache lines, or main memory addresses) and read or write data from the corresponding location on one of DRAM device 120 or SCM device 130. In one embodiment, a first data channel 126 and a second data channel 128 are coupled between memory controller 110 and DRAM device 120. Command and address (CA) channel 129 may be further coupled between memory controller 110 and DRAM device 120. The first data channel 126 may be used, for example, to transfer data pertaining to "normal" host access requests, such as data read from a portion of DRAM device 120 not being used as cache memory in response to a read request from processing device 170 or data being written to DRAM device 120 in response to a write request from processing device 170. The second data channel 128 may be used to transfer block data pertaining to cache operations associated with SCM device 130, such as data read from a portion of DRAM device 120 being used as cache memory as part of a cache eviction operation, or being written to DRAM device 120 as part of a cache fill operation.

In one embodiment, cache controller 140 includes cache control logic 148 which coordinates the storage of tag data in a tag cache 150 (e.g., an SRAM device). Depending on the size of the DRAM device 120 and the size of a cache line, the tag storage may be too big to fit in tag cache 150 in the cache controller 140. Thus, in certain embodiments, the full set of tags can be stored in DRAM device 120 and only a subset of the tags can be cached in tag cache 150. When data from the SCM device 130 is stored in DRAM device 120 as cache data, such as to enable faster access to frequently used data, a cache tag can be used to uniquely identify the corresponding piece of data. When the data is requested, such as by processing device 170, cache control logic 148 can compare the stored cache tag from tag cache 150 to a tag provided by the requestor to ensure that the proper piece of data is retrieved from the DRAM device 120. In one embodiment, the cache tag comprises a portion of a memory address of the cache line from the SCM device 130. For example, some designated number of the most significant bits of the memory address may be used as the cache tag.

In one embodiment, a data access request, such as a read request or a write request is received from processing device 170 and stored in a request queue 142. Control logic 148 reads the request from request queue 142 and compares the tag received with the request to the tag data in tag cache 150 to determine whether a copy of the relevant data is currently cached in DRAM device 120. If a matching tag is found in the tag cache 150, indicating that relevant data is in DRAM device 120, control logic 148 may issue a control signal to selection device 146 (e.g., a multiplexer) to cause the command in request queue 142 to be forwarded to memory controller 110 for execution. In one embodiment, memory controller 110 may read data from or write data to DRAM device 120, as appropriate, over the first data channel 126. For example, memory controller 110 may retrieve read data from DRAM device 120 and either store the read data temporarily in read/write buffers 152 or directly return the requested data to processing device 170.

If a matching tag is not found in the tag cache 150, indicating that relevant data is not in DRAM device 120, control logic 148 may send a request to SCM controller 180 to retrieve the relevant data from SCM 130. In one embodiment, SCM controller 180 may retrieve the relevant data from SCM 130 using data channel 132 and store the retrieved data temporarily in read/write buffers 152. The retrieved data may be returned to processing device 170 from read/write buffers 152 while also loaded into request queue 144 as part of a cache fill operation. Control logic 148 may issue a control signal to selection device 146 to cause the command/data in request queue 144 to be forwarded to memory controller 110 for execution. In one embodiment, memory controller 110 may write data to a designated rank (e.g., rank0 122 or rank1 124) of DRAM device 120 over the second data channel 128. Control logic 148 may further instruct block transfer (xfr) logic 160 to provide memory controller 110 with a "rank busy status" signal. As such, the first data channel 126 remains available to continue servicing host data access requests to a non-busy rank of the DRAM device 120. In one embodiment, block data traffic may be transferred across the second data channel 128 concurrently with other data traffic being transferred across the first data channel 126. For example, the block data transfer across the second data channel 128 may overlap at least partially in time with the other data transfer across the first data channel 126.

When a cache fill operation is performed, an associated cache evict operation may also be performed. For example, if the cache memory in the DRAM device 120 is at capacity, a cache line currently in the DRAM device 120 can be evicted to make space available for the new cache line from SCM 130. Any type of cache eviction policy can be used to identify which cache line to evict, such as first in first out (FIFO), last in first out (LIFO), least recently used (LRU), most recently used (MRU), least frequently used (LFU), pseudorandom or random replacement, etc. In one embodiment, memory controller 110 may retrieve the cache line identified for eviction from the DRAM device 120 using the second data bus 128 and store the retrieved cache line temporarily in read/write buffers 152. SCM controller 180 may then write the cache line data to SCM 130 using data channel 132 and notify control logic 148 to update the entries in tag cache 150.

Figure 2:
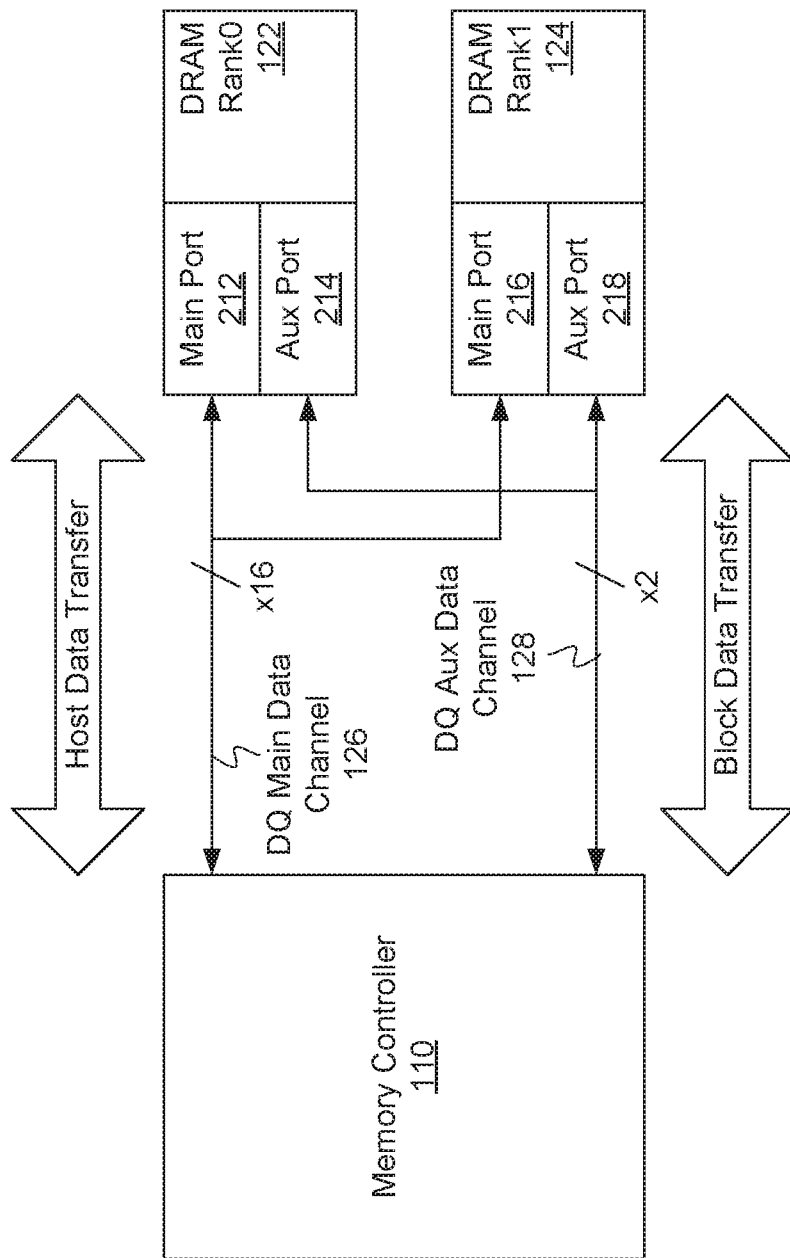
FIG. 2 is a block diagram illustrating a memory system with a dedicated block data transmission channel, according to an embodiment.

FIG. 2 is a block diagram illustrating a memory system with a dedicated block data transmission channel, according to an embodiment. As described above, in one embodiment, a first data channel 126 (i.e., a primary or main DQ channel) and a second data channel 128 (i.e., a dedicated auxiliary DQ channel) are coupled between memory controller 110 and memory ranks of the DRAM device, such as rank0 122 and rank1 124. For example, the first data channel 126 may couple to a main port 212 of rank0 122 and to a main port 216 of rank1 124, while the second data channel 128 may couple to an auxiliary port 214 of rank 0 122 and to an auxiliary port 218 of rank 1 124. In other embodiments, the DRAM device may include some other number of memory ranks, each accessible by the first data channel 126 and the second data channel 128. In another embodiment, the memory system may include multiple DRAM devices, each having a separate primary DQ channel and a dedicated auxiliary DQ channel. Each DRAM device, may further be coupled to memory controller 110 by a CA channel (not illustrated in FIG. 2.)

The first data channel 126 may be used, for example, to perform a first data transfer operation for first data between the memory controller 110 and a first portion of the DRAM device (e.g., rank0 122). The first data transfer operation (i.e., a host data transfer) may include transferring the first data on behalf of a host (e.g., processing device 170 of FIG. 1) in response to a data access request, such as a read access request or a write access request. Accordingly, the first data transfer operation may include either transferring the first data from memory controller 110 to rank0 122 via the first data channel 126 as part of a write access operation, when rank0 122 is being used as main memory and not as a cache memory for the SCM device 130, or transferring the first data from rank0 122 to memory controller 110 via the first data channel 126 as part of a read access operation.

The second data channel 128 may be used, for example, to perform a second data transfer operation for second data between the memory controller 110 and a second portion of the DRAM device (e.g., rank1 124). The second data transfer operation (i.e., a block data transfer) may include transferring the second data on behalf of a main memory (e.g., SCM device 130 of FIG. 1) in response to a cache fill or cache evict command. Accordingly, the second data transfer operation may include either transferring the second data from memory controller 110 to rank1 124 via the second data channel 128 as part of a cache fill operation, when rank1

124 is being used as a cache memory for the SCM device 130, or transferring the second data from rank1 124 to memory controller 110 via the second data channel 128 as part of a cache evict operation. In one embodiment, the second data transfer operation may be performed on the second data channel 128 concurrently with the first data transfer operation being performed on the first data channel 126.

In one embodiment, if a higher priority data access request is received from the host that is directed to data in the memory rank (i.e., rank 1 124) currently being accessed as part of the second data transfer operation, the cache controller 140 may pause the second data transfer operation in order to service the higher priority request. The cache controller 140 may cause memory controller 110 to perform a third data transfer operation for third data between the memory controller 110 and the second portion of the DRAM device (e.g., rank1 124). The third data transfer operation (i.e., a host data transfer) may include transferring the third data on behalf of a host (e.g., processing device 170 of FIG. 1) in response to a data access request, such as a read access request or a write access request. Accordingly, the third data transfer operation may include either transferring the third data from memory controller 110 to rank1 124 via the first data channel 126 as part of a write access operation or transferring the third data from rank1 124 to memory controller 110 via the first data channel 126 as part of a read access operation. Once the third data transfer operation is complete, the second data transfer operation can be resumed using the second data channel 128.

Figure 3:
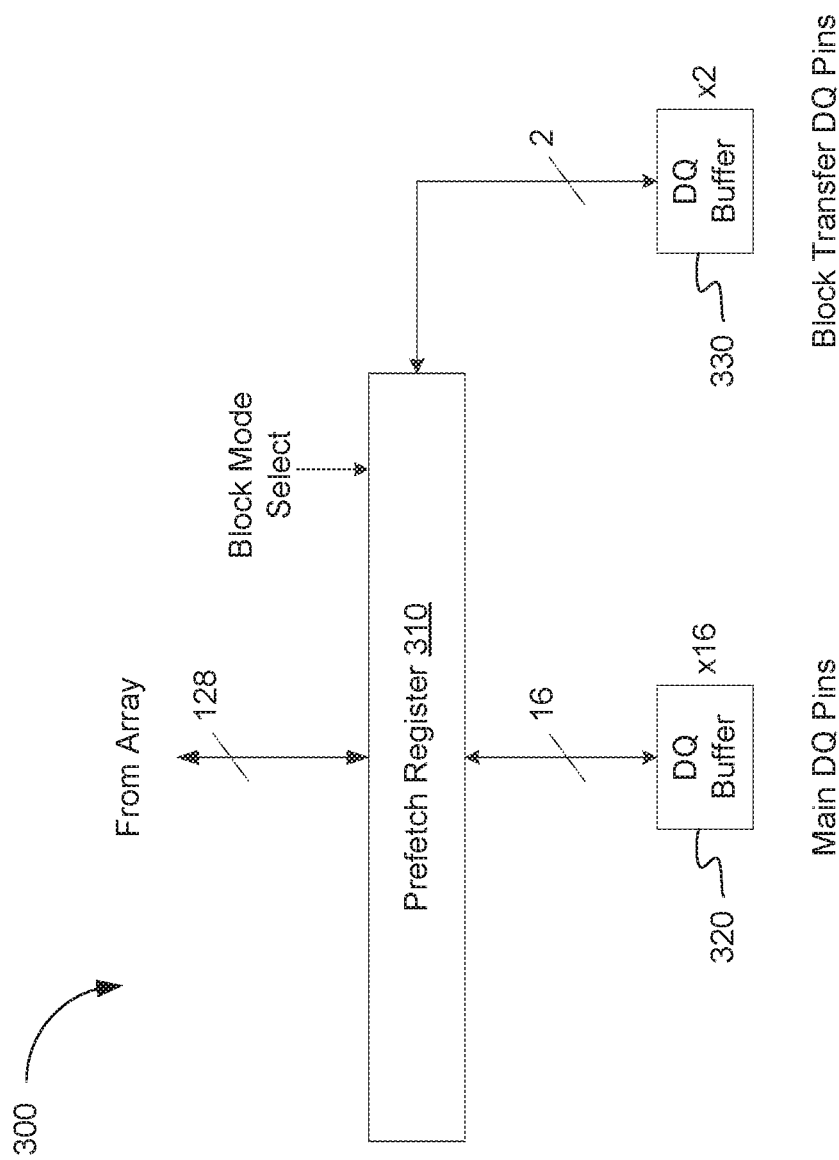
FIG. 3 is a block diagram illustrating bus logic for a memory device in a memory system with a dedicated block data transmission channel, according to an embodiment.

FIG. 3 is a block diagram illustrating bus logic 300 for a memory device in a memory system with a dedicated block data transmission channel, according to an embodiment. In one embodiment, the bus logic 300 is implemented in each rank (i.e., rank0 122, rank1 124) of the DRAM device 120, and may form at least a portion of the main ports 212, 216 and the auxiliary ports 214, 218 illustrated in FIG. 2. In one embodiment, the bus logic 300 includes a prefetch register 310 and two data buffers 320 and 330. Data buffer 320 may be used to transfer data via a set of main DQ pins coupled to the first data channel 126 and data buffer 330 may be used to transfer data via a set of block transfer DQ pins coupled to the second data channel 126. Depending on a status of a block mode select signal (e.g., received from memory controller 110) prefetch register 310 may communicate with either data buffer 320 or data buffer 330, as appropriate. When performing a read operation, prefetch register 310 may obtain the relevant data from the array of memory cells in the corresponding DRAM rank and provide the retrieved data to either data buffer 320 or data buffer 330, depending on the mode, which can then be transferred to memory controller 110 via the first data channel 126 or the second data channel 128, respectively. When performing a write operation, prefetch register 310 may obtain the relevant data from either data buffer 320 or data buffer 330, received via the first data channel 126 or the second data channel 128, respectively, and write that data to the corresponding location in the array of memory cells of the DRAM rank.

Figure 4:
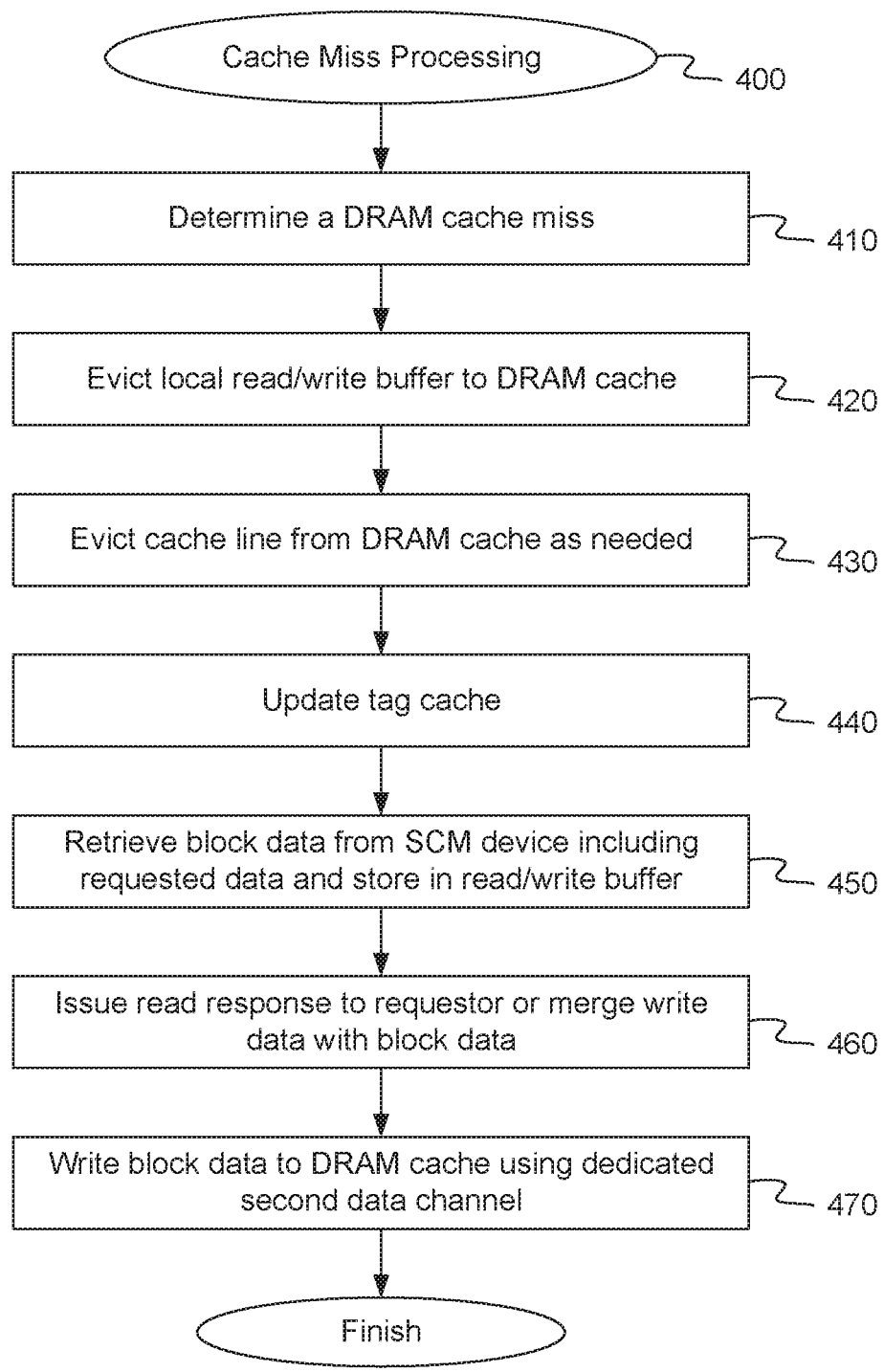
FIG. 4 is a flow diagram illustrating a method of cache miss processing in a memory system with a dedicated block data transmission channel, according to an embodiment.

FIG. 4 is a flow diagram illustrating a method of cache miss processing in a memory system with a dedicated block data transmission channel, according to an embodiment. The method 400 may be performed by processing logic that may comprise hardware (e.g., circuitry, dedicated logic, programmable logic, microcode, etc.), software (e.g., instructions run on a processing device to perform hardware simulation), or a combination thereof. In one embodiment, the method 400 is performed by cache control logic 148 in the cache controller 140, as shown in FIG. 1.

Referring to FIG. 4, at block 410, method 400 determines the occurrence of cache miss in the portion of the DRAM device 120 used as a cache for the SCM device 130. In response to a data access request, such as a read access request or a write access request from processing device 170, cache control logic 148 can compare a cache tag provided by the requestor with cache tag data stored in tag cache 150 to determine whether the relevant data is present on the DRAM device 120. If the tag data from the request does not match any tag data in tag cache 150, control logic 148 can determine that a cache miss has occurred.

At block 420, method 400 evicts the local read/write buffers 152 to the DRAM cache. In one embodiment, cache control logic 148 determines whether any data is presently stored in read/write buffers 152, and if so, writes that data to the portion of the DRAM device 120 being used as a cache.

At block 430, method 400 evicts a cache line from the DRAM cache as needed. Cache control logic 148 determines whether the cache memory in the DRAM device 120 is at capacity, and if so, evicts a cache line currently in the DRAM device 120 to make space available for a new cache line from SCM 130. As described above, any type of cache eviction policy can be used to identify which cache line to evict, such as FIFO, LIFO, LRU, MRU, LFU, pseudorandom or random replacement, etc. In one embodiment, memory controller 110 may retrieve the cache line identified for eviction from the DRAM device 120 using the second data bus 128 and store the retrieved cache line temporarily in read/write buffers 152. SCM controller 180 may then write the cache line data to SCM 130 using data channel 132.

At block 440, method 400 updates the tag cache 150. Upon completion of the cache eviction, control logic 148 may remove the tag data corresponding to the evicted cache line from tag cache 150.

At block 450, method 400 retrieves block data from the SCM device 130 including the requested data and stores the block data in read/write buffers 152. In one embodiment, control logic 148 sends a request to SCM controller 180 to retrieve the relevant data from SCM 130. In one embodiment, SCM controller 180 may retrieve the relevant data from SCM 130 using data channel 132 and store the retrieved data temporarily in read/write buffers 152.

At block 460, method 400 issues a read response to the requestor or merges the write data with the block data. Depending on the nature of the initial data access request, the retrieved data may be returned to processing device 170 from read/write buffers 152 or write data may be merged with the block data. For example, in response to a read request, control logic 148 may identify the requested read data from the block data in read/write buffers 152 and provide the requested read data to processing device 170. In response to a write request, however, control logic 148 may write any write data received with the request to the block data in read/write buffers 152.

At block 470, method 400 writes the block data to the DRAM cache using the dedicated second data channel 128. In one embodiment, control logic 148 loads the block data into request queue 144 as part of a cache fill operation. Control logic 148 may issue a control signal to selection device 146 to cause the block data in request queue 144 to be forwarded to memory controller 110. In one embodiment, memory controller 110 may write the block data to a designated rank (e.g., rank0 122 or rank1 124) of DRAM device 120 over the second data channel 128.

is a flow diagram illustrating a method of a block read transfer sequence in a memory system with a dedicated block data transmission channel, according to an embodiment. The method 500 may be performed by processing logic that may comprise hardware (e.g., circuitry, dedicated logic, programmable logic, microcode, etc.), software (e.g., instructions run on a processing device to perform hardware simulation), or a combination thereof. In one embodiment, the method 500 is performed by cache control logic 148 in the cache controller 140, as shown in FIG. 1.

Figure 5:
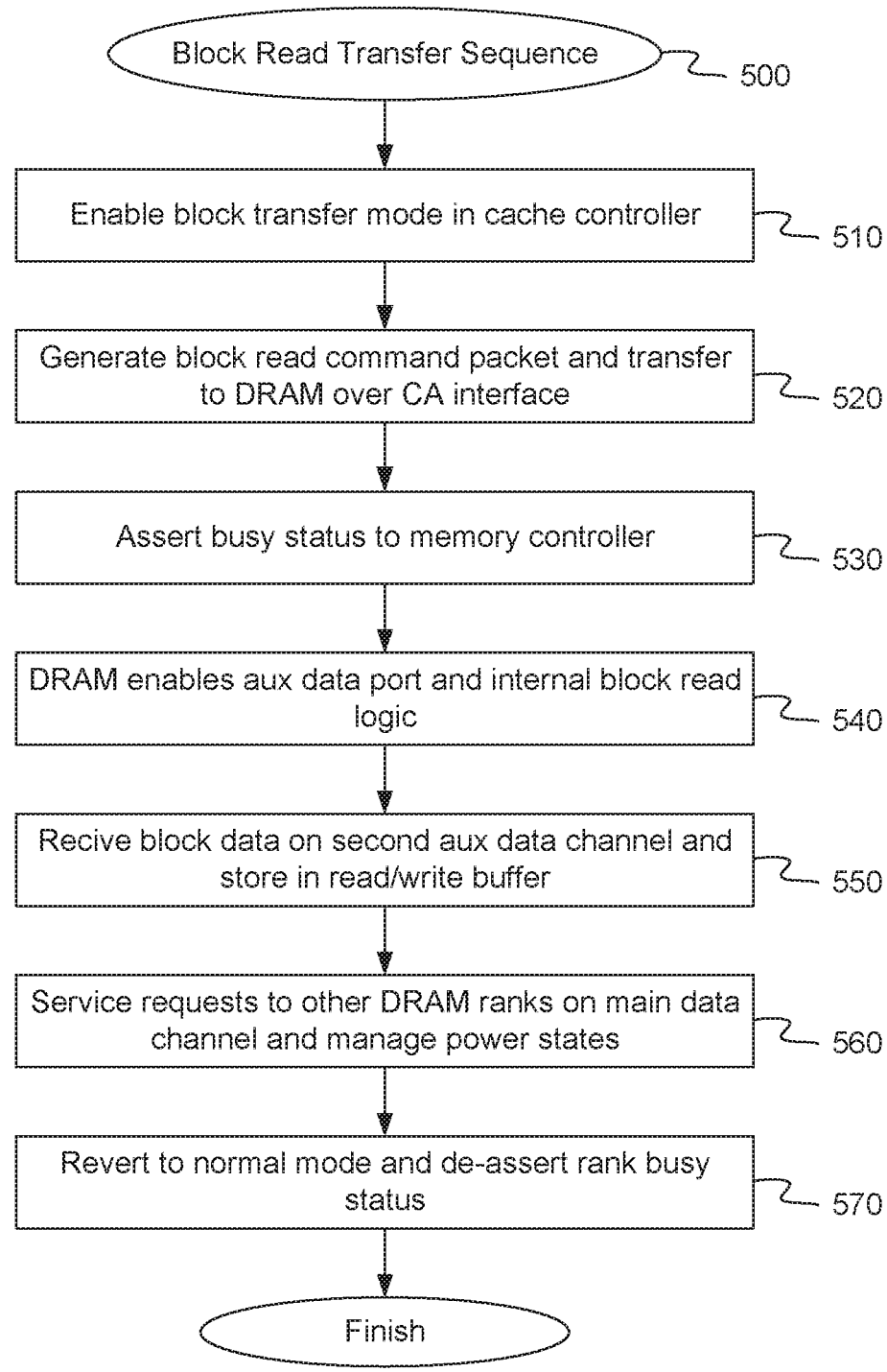
FIG. 5 is a flow diagram illustrating a method of a block read transfer sequence in a memory system with a dedicated block data transmission channel, according to an embodiment.

Referring to FIG. 5, at block 510, method 500 enables a block transfer mode in the cache controller 140. In one embodiment, upon determining that a block transfer is to occur, cache control logic 148 asserts a control signal to selection circuit 146 to transfer data from queue 144 and instructs SCM controller 180 to send or receive block data from the SCM device 130, as appropriate. At block 520, method 500 generates a block read command packet and transfers said packet to the DRAM device 120 over CA interface 129. The block read command packet comprises an indication of a relevant memory address in one of rank0 122 or rank1 124 of the DRAM device 120. At block 530, method 500 asserts a rank busy status signal to memory controller 110. In one embodiment, cache control logic 148 instructs block transfer logic 160 to provide memory controller 110 with a "rank busy status" signal to indicate that the second data bus 128 will be activated to perform a data transfer with a relevant one of rank0 122 or rank1 124 of the DRAM device 120. At block 540, method 500 causes the DRAM device 120 to enable an auxiliary data port 218 and internal block read logic.

At block 550, method 500 receives block data from the DRAM device 120 using second data channel 128 and stores the block data in read/write buffers 152. In one embodiment, memory controller 110 may retrieve the cache line identified for eviction from the DRAM device 120 using the second data bus 128 and store the retrieved cache line temporarily in read/write buffers 152. SCM controller 180 may then write the cache line data to SCM 130 using data channel 132 and notify control logic 148 to update the entries in tag cache 150.

At block 560, method 500 services requests to other memory ranks of the DRAM device 120 using the first data channel 126 and manages power states of the data channels. In one embodiment, the first data channel 126 remains available to continue servicing host data access requests to a non-busy rank of the DRAM device 120. In one embodiment, block data traffic may be transferred across the second data channel 128 concurrently with other data traffic being transferred across the first data channel 126. For example, the block data transfer across the second data channel 128 may overlap at least partially in time with the other data transfer across the first data channel 126. At block 570, method 500 reverts to a normal mode in the cache controller 140 and de-asserts the rank busy status signal.

Figure 6:
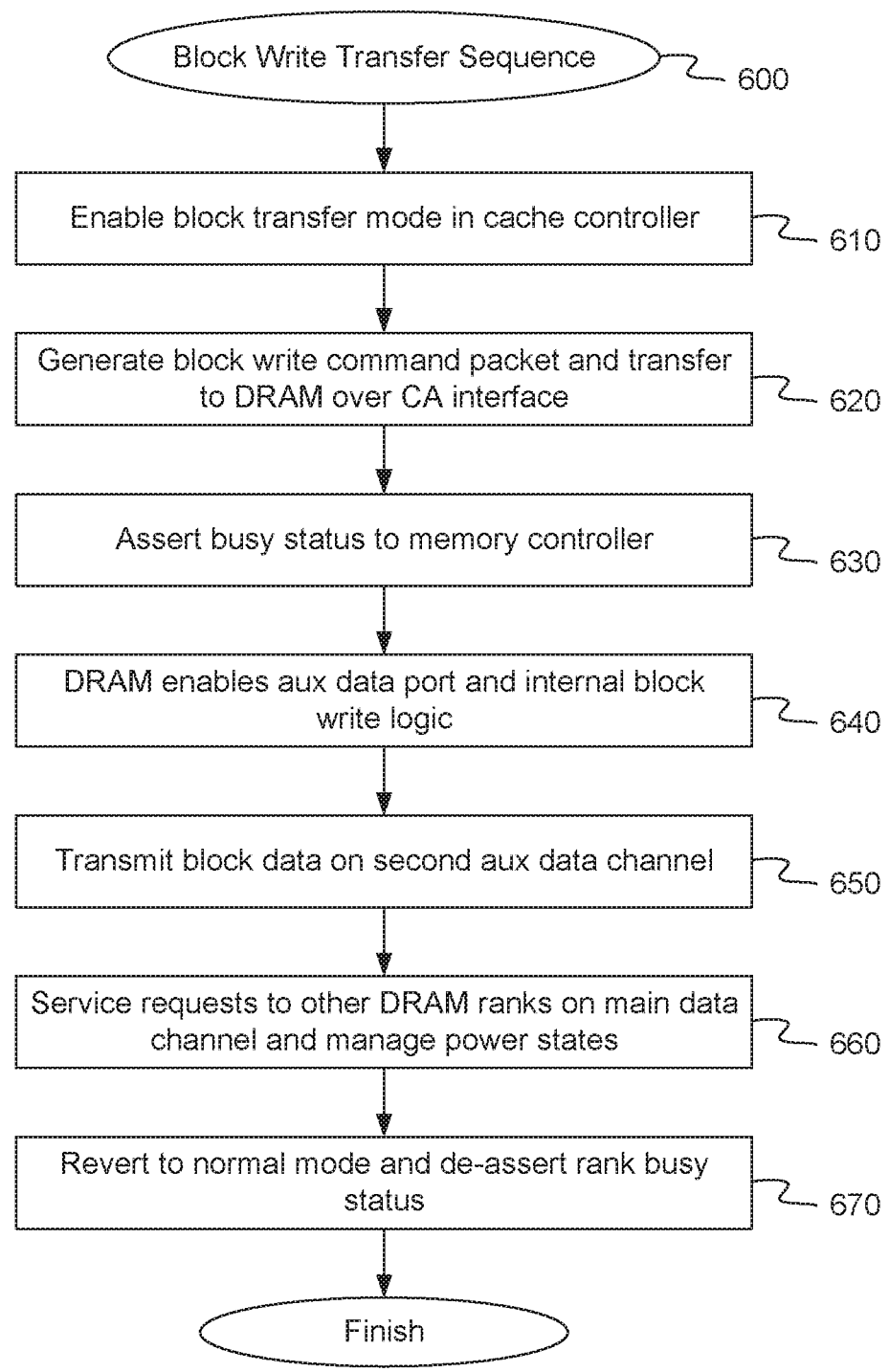
FIG. 6 is a flow diagram illustrating a method of a block write transfer sequence in a memory system with a dedicated block data transmission channel, according to an embodiment.
Figure 7:
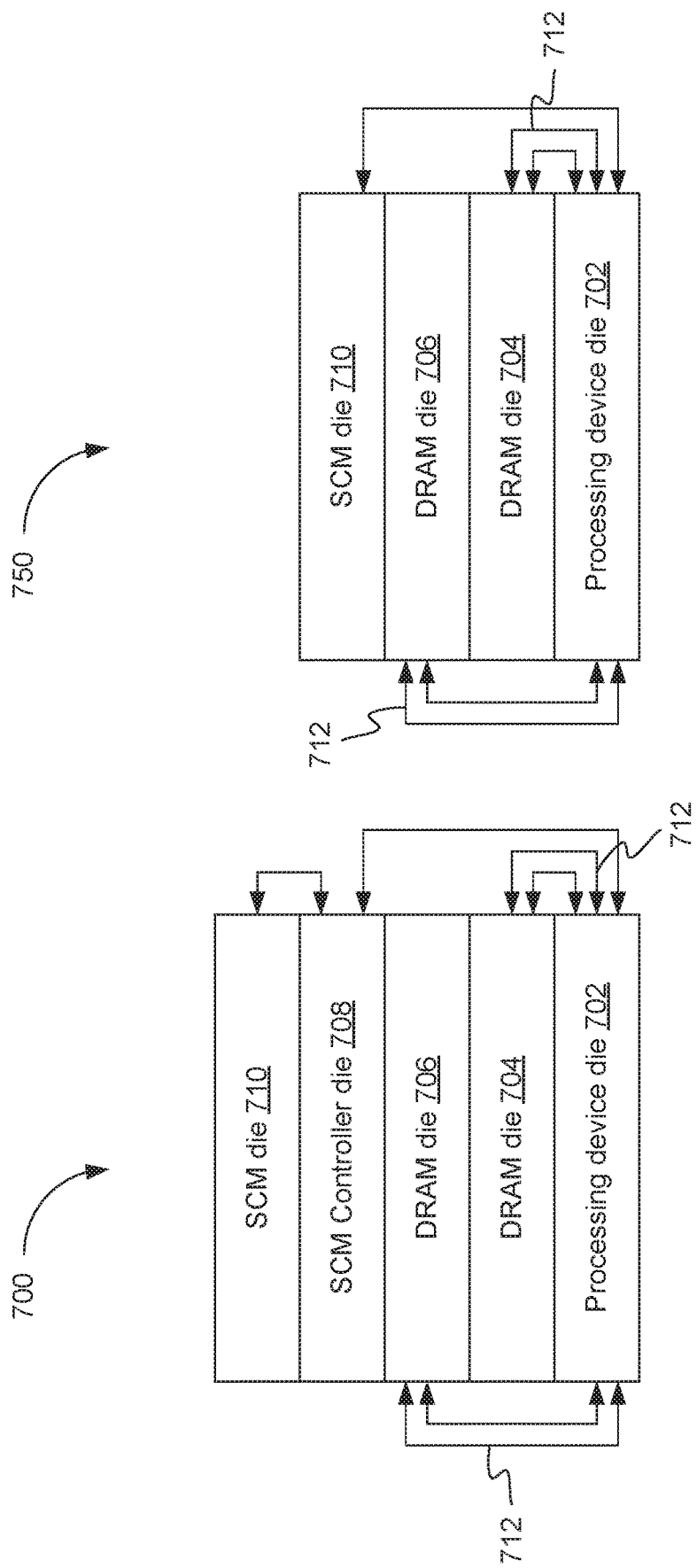
FIGS. 7A and 7B are logical block diagrams of a stacked memory system with a dedicated block data transmission channel, according to embodiments.

FIG. 6 is a flow diagram illustrating a method of a block write transfer sequence in a memory system with a dedicated block data transmission channel, according to an embodiment. The method 600 may be performed by processing logic that may comprise hardware (e.g., circuitry, dedicated logic, programmable logic, microcode, etc.), software (e.g., instructions run on a processing device to perform hardware simulation), or a combination thereof. In one embodiment, the method 600 is performed by cache control logic 148 in the cache controller 140, as shown in FIG. 1.

Referring to FIG. 6, at block 610, method 600 enables a block transfer mode in the cache controller 140. In one embodiment, upon determining that a block transfer is to occur, cache control logic 148 asserts a control signal to selection circuit 146 to transfer data from queue 144 and instructs SCM controller 180 to send or receive block data from the SCM device 130, as appropriate. At block 620, method 600 generates a block write command packet and transfers said packet to the DRAM device 120 over CA interface 129. The block write command packet comprises an indication of a relevant memory address in one of rank0 122 or rank1 124 of the DRAM device 120. At block 630, method 600 asserts a rank busy status signal to memory controller 110. In one embodiment, cache control logic 148 instructs block transfer logic 160 to provide memory controller 110 with a "rank busy status" signal to indicate that the second data bus 128 will be activated to perform a data transfer with a relevant one of rank0 122 or rank1 124 of the DRAM device 120. At block 640, method 600 causes the DRAM device 120 to enable an auxiliary data port 218 and internal block write logic.

At block 650, method 600 transmits block data to the DRAM device 120 using second data channel 128. In one embodiment, control logic 148 sends a request to SCM controller 180 to retrieve the relevant data from SCM 130. In one embodiment, SCM controller 180 may retrieve the relevant data from SCM 130 using data channel 132 and store the retrieved data temporarily in read/write buffers 152. Write data received from the requestor may be merged with the block data and transmitted to DRAM device 120 using the second data channel 128.

At block 660, method 600 services requests to other memory ranks of the DRAM device 120 using the first data channel 126 and manages power states of the data channels. In one embodiment, the first data channel 126 remains available to continue servicing host data access requests to a non-busy rank of the DRAM device 120. In one embodiment, block data traffic may be transferred across the second data channel 128 concurrently with other data traffic being transferred across the first data channel 126. For example, the block data transfer across the second data channel 128 may overlap at least partially in time with the other data transfer across the first data channel 126. At block 670, method 600 reverts to a normal mode in the cache controller 140 and de-asserts the rank busy status signal.

FIGS. 7A and 7B are logical block diagrams of a stacked memory system with a dedicated block data transmission channel, according to embodiments. Depending on the embodiment, certain components of the memory system 100 may be implemented in a stacked memory system, such as stack configuration 700 illustrated in FIG. 7A or stack configuration 750 illustrated in FIG. 7B.

In one embodiment, stack configuration 700 is formed from a number of semiconductor dies, including processing device die 702, on which processing device 170, cache controller 140, and memory controller 110 may be implemented, DRAM dies 704 and 706, on which DRAM device 120 may be implemented, SCM controller die 708, on which SCM controller 180 may be implemented, and SCM die 710, on which SCM device 130 may be implemented. In one embodiment, each DRAM dies 704 and 706 may be x32 with two x16 data channels. Stack configuration 700 may include a single rank x64 DRAM interface for the two DRAM dies 704 and 706. In addition to this regular data interface, stack configuration 700 further includes a separate dedicated block data transmission channel 712 between processing device die 702 and each of DRAM dies 704 and 706. This dedicated block data transmission channel 712 may be representative of data channel 128, as shown in FIGS. 1 and 2.

In one embodiment, stack configuration 750 is formed from a number of semiconductor dies, including processing device die 702, DRAM dies 704 and 706, and SCM die 710. In this embodiment, SCM controller 180 may be implemented on processing device die 702 along with processing device 170, cache controller 140, and memory controller 110, rather than on its own separate die. As in stack configuration 700, stack configuration 750 includes separate dedicated block data transmission channel 712 between processing device die 702 and each of DRAM dies 704 and 706.

Figure 8:
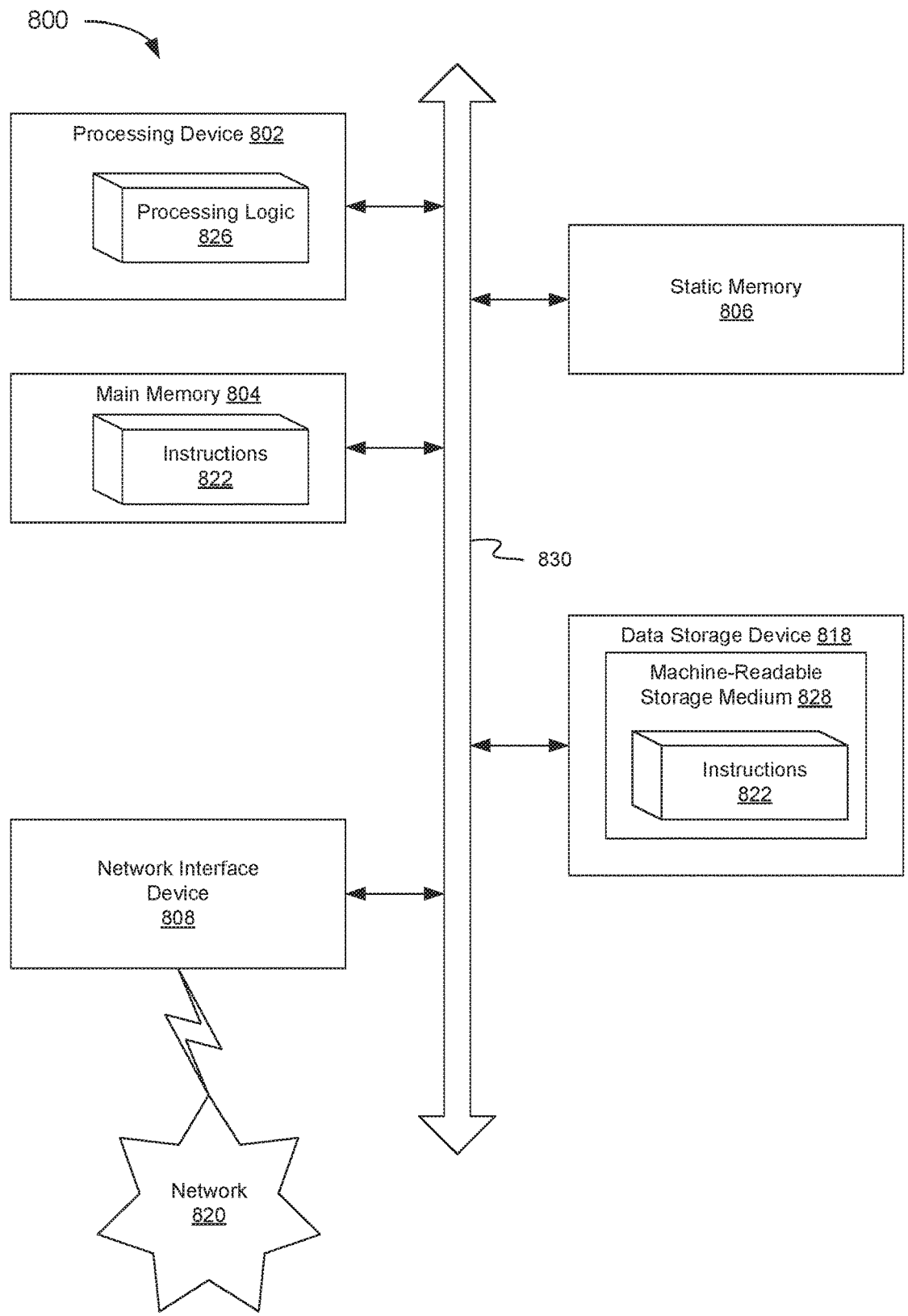
FIG. 8 depicts an example computer system which can perform any one or more of the operations described herein, in accordance with one or more aspects of the present disclosure.

FIG. 8 depicts an example computer system 800 which can perform any one or more of the methods described herein, in accordance with one or more aspects of the present disclosure. In one example, computer system 800 may correspond to a computing device capable of executing one or more of the components described herein. The computer system 800 may be connected (e.g., networked) to other computer systems in a local area network (LAN), an intranet, an extranet, or the Internet. The computer system 800 may operate in the capacity of a server in a client-server network environment. The computer system 800 may be a personal computer (PC), a tablet computer, a set-top box (STB), a personal Digital Assistant (PDA), a mobile phone, a camera, a video camera, or any device capable of executing a set of instructions (sequential or otherwise) that specify actions to be taken by that device. Further, while only a single computer system is illustrated, the term "computer" shall also be taken to include any collection of computers that individually or jointly execute a set (or multiple sets) of instructions to perform any one or more of the methods discussed herein.

The exemplary computer system 800 includes a processing device 802, a main memory 804 (e.g., read-only memory (ROM), flash memory, dynamic random access memory (DRAM) such as synchronous DRAM (SDRAM)), a static memory 806 (e.g., flash memory, static random access memory (SRAM)), and a data storage device 818, which communicate with each other via a bus 830. For example, main memory 804 may be representative of DRAM device 120, and data storage device 818 may be representative of SCM device 130, as shown in FIGS. 1 and 2.

Processing device 802 represents one or more general-purpose processing devices such as a microprocessor, central processing unit, or the like and may be representative, for example, of processing device 170, as shown in FIG. 1. More particularly, the processing device 802 may be a complex instruction set computing (CISC) microprocessor, reduced instruction set computing (RISC) microprocessor, very long instruction word (VLIW) microprocessor, or a processor implementing other instruction sets or processors implementing a combination of instruction sets. The processing device 802 may also be one or more special-purpose processing devices such as an application specific integrated circuit (ASIC), a field programmable gate array (FPGA), a digital signal processor (DSP), network processor, or the like. The processing device 802 is configured to execute instructions for performing the operations and steps discussed herein. The computer system 800 may further include a network interface device 808 to couple computer system 800 to network 820.

The data storage device 818 may include a computer-readable medium 828 on which the instructions 822 (e.g., implementing cache control logic 148) embodying any one or more of the methodologies or functions described herein is stored. The instructions 822 may also reside, completely or at least partially, within the main memory 804 and/or within the processing device 802 (where they may be referred to as processing logic 826) during execution thereof by the computer system 800, the main memory 804 and the processing device 802 also constituting computer-readable media. The instructions 822 may further be transmitted or received over a network via the network interface device 808.

While the computer-readable storage medium 828 is shown in the illustrative examples to be a single medium, the term "computer-readable storage medium" should be taken to include a single medium or multiple media (e.g., a centralized or distributed database, and/or associated caches and servers) that store the one or more sets of instructions. The term "computer-readable storage medium" shall also be taken to include any medium that is capable of storing, encoding or carrying a set of instructions for execution by the machine and that cause the machine to perform any one or more of the methodologies of the present disclosure. The term "computer-readable storage medium" shall accordingly be taken to include, but not be limited to, solid-state memories, optical media, and magnetic media.

Although the operations of the methods herein are shown and described in a particular order, the order of the operations of each method may be altered so that certain operations may be performed in an inverse order or so that certain operation may be performed, at least in part, concurrently with other operations. In certain implementations, instructions or sub-operations of distinct operations may be in an intermittent and/or alternating manner.

It is to be understood that the above description is intended to be illustrative, and not restrictive. Many other implementations will be apparent to those of skill in the art upon reading and understanding the above description. The scope of the disclosure should, therefore, be determined with reference to the appended claims, along with the full scope of equivalents to which such claims are entitled.

In the above description, numerous details are set forth. It will be apparent, however, to one skilled in the art, that the aspects of the present disclosure may be practiced without these specific details. In some instances, well-known structures and devices are shown in block diagram form, rather than in detail, in order to avoid obscuring the present disclosure.

Some portions of the detailed descriptions above are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, as apparent from the following discussion, it is appreciated that throughout the description, discussions utilizing terms such as "receiving," "determining," "selecting," "storing," "setting," or the like, refer to the actions and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The present disclosure also relates to an apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear as set forth in the description. In addition, aspects of the present disclosure are not described with reference to any particular programming language. It will be appreciated that a variety of programming languages may be used to implement the teachings of the present disclosure as described herein.

Aspects of the present disclosure may be provided as a computer program product, or software, that may include a machine-readable medium having stored thereon instructions, which may be used to program a computer system (or other electronic devices) to perform a process according to the present disclosure. A machine-readable medium includes any procedure for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.).

What is claimed is:

1. A cache controller circuit in a block transfer mode, the cache controller circuit comprising:
    a data buffer; and
    logic coupled to the data buffer, wherein the logic is to:
        transfer first data to a dynamic random access memory (DRAM) device over a first data channel via a memory controller circuit;
        send a block read command packet to the DRAM device via the memory controller circuit;
        provide a status signal to the memory controller circuit, the status signal to indicate that a second data channel between the memory controller circuit and the DRAM device is activated to perform a data transfer with a first rank of the DRAM device on behalf of a second memory device while the first data is being transferred across the first data channel between the memory controller circuit and the DRAM device;
        cause the DRAM device to enable an auxiliary data port and block read logic of the DRAM device; and
        receive second data over the second data channel from the auxiliary data port; and
        store the second data in the data buffer.

2. The cache controller circuit of claim 1, wherein the logic is further to:
    determine that a block transfer is to occur;
    enable the block transfer mode responsive to a determination that the block transfer is to occur; and
    instruct, in the block transfer mode, a second memory controller coupled to the second memory device to transfer the second data in the data buffer to the second memory device.

3. The cache controller circuit of claim 1, wherein, to send the block read command packet, the logic is further to send the block read command packet over a command and address (CA) interface, wherein the block read command packet comprises an indication of a memory address the first rank.

4. The cache controller circuit of claim 1, wherein the second data comprises block data of a fixed size.

5. The cache controller circuit of claim 1, wherein the second data comprises a cache line.

6. The cache controller circuit of claim 1, wherein the logic is further to:
    retrieve a cache line identified for eviction from the DRAM device using the second data channel, the cache line comprising the second data; and
    store the cache line in the data buffer, wherein the second data of the cache line is written to the second memory device by a second memory controller coupled to the second memory device.

7. The cache controller circuit of claim 6, wherein the logic is further to update an entry in a tag cache to indicate that the cache line is evicted from the DRAM device.

8. The cache controller circuit of claim 1, wherein the logic is further to:
    receive, during the block transfer mode, a data access request for a second rank of the DRAM device from a host device coupled to the cache controller circuit; and
    service the data access request on the first data channel, responsive to the data access request.

9. The cache controller circuit of claim 8, wherein the data access request occurs concurrently with the second data being received over the second data channel from the auxiliary data port.

10. The cache controller circuit of claim 8, wherein the data access request overlaps at least partially in time with the second data being received over the second data channel from the auxiliary data port.

11. A cache controller circuit in a block transfer mode, the cache controller circuit comprising:
    a data buffer; and
    logic coupled to the data buffer, wherein the logic is to:
        transfer first data to a dynamic random access memory (DRAM) device over a first data channel via a memory controller circuit;
        send a block write command packet to the DRAM device via the memory controller circuit;
        provide a status signal to the memory controller circuit, the status signal to indicate that a second data channel between the memory controller circuit and the DRAM device is activated to perform a data transfer with a first rank of the DRAM device on behalf of a second memory device while the first data is being transferred across the first data channel between the memory controller circuit and the DRAM device;
cause the DRAM device to enable an auxiliary data port and block write logic of the DRAM device;
store second data in the data buffer of the cache controller circuit; and
send the second data over the second data channel to the auxiliary data port.

12. The cache controller circuit of claim 11, wherein the logic is further to:
determine that a block transfer is to occur;
enable the block transfer mode responsive to a determination that the block transfer is to occur; and
instruct, in the block transfer mode, a second memory controller coupled to the second memory device to transfer the second data from the second memory device into the data buffer to the second memory device.

13. The cache controller circuit of claim 11, wherein, to send the block write command packet, the logic is further to send the block write command packet over a command and address (CA) interface, wherein the block write command packet comprises an indication of a memory address the first rank.

14. The cache controller circuit of claim 11, wherein the second data comprises block data of a fixed size.

15. The cache controller circuit of claim 11, wherein the second data comprises a cache line.

16. The cache controller circuit of claim 11, wherein the logic is further to:
Store the second data in the data buffer as a cache line, where the second data is read from the second memory device by a secondary memory controller coupled to the second memory device; and
send the cache line, identified for a cache fill operation, to the DRAM device using the second data channel.

17. The cache controller circuit of claim 16, wherein the logic is further to update an entry in a tag cache to indicate that the cache line is stored in the DRAM device.

18. The cache controller circuit of claim 11, wherein the logic is further to:
receive, during the block transfer mode, a data access request for a second rank of the DRAM device from a host device coupled to the cache controller circuit; and
service the data access request on the first data channel, responsive to the data access request.

19. The cache controller circuit of claim 18, wherein the data access request occurs concurrently with the second data being sent over the second data channel to the auxiliary data port.

20. The cache controller circuit of claim 18, wherein the data access request overlaps at least partially in time with the second data being sent over the second data channel to the auxiliary data port.

* * * * *